United States Patent [19]
Kendall

[11] Patent Number: 5,619,417
[45] Date of Patent: Apr. 8, 1997

[54] BATTERY MONITORING SYSTEM FOR AN ELECTRIC VEHICLE

[75] Inventor: Jeffrey M. Kendall, Southfield, Mich.

[73] Assignee: Chrysler Corporation, Auburn Hill, Mich.

[21] Appl. No.: 344,036

[22] Filed: Nov. 23, 1994

[51] Int. Cl.$^6$ .................................................. G01R 19/00
[52] U.S. Cl. ................................ 364/483; 364/424.026; 364/481; 364/492; 320/17; 320/48; 320/43; 320/49; 307/10.1
[58] Field of Search .................................. 364/481, 483, 364/550, 551.01, 424.01, 492; 320/48, 43, 40, 49, 17; 307/10.1, 10.7; 150/65.3

[56] References Cited

U.S. PATENT DOCUMENTS

| | | | |
|---|---|---|---|
| 3,786,343 | 1/1974 | Ehlers | 324/29.5 |
| 4,198,597 | 4/1980 | Sawyer | 324/434 |
| 4,217,645 | 8/1980 | Barry et al. | 364/483 |
| 4,280,097 | 7/1981 | Carey et al. | 324/434 |
| 4,390,841 | 6/1983 | Martin et al. | 324/427 |
| 4,423,362 | 12/1983 | Konrad et al. | 318/139 |
| 4,423,378 | 12/1983 | Marino et al. | 324/427 |
| 4,449,247 | 5/1984 | Waschka, Jr. | 455/9 |
| 4,484,130 | 11/1984 | Lowndes et al. | 320/40 |
| 4,630,218 | 12/1986 | Hurley | 364/481 |
| 4,684,872 | 8/1987 | Stewart | 320/45 |
| 4,833,459 | 5/1989 | Geuer et al. | 340/636 |
| 4,965,550 | 10/1990 | Wroblewski | 340/524 |
| 5,005,142 | 4/1991 | Lipchak et al. | 364/550 |
| 5,027,294 | 6/1991 | Fakruddin et al. | 364/550 |
| 5,047,961 | 9/1991 | Simonsen | 364/550 |
| 5,130,659 | 7/1992 | Sloan | 324/435 |
| 5,206,097 | 4/1993 | Burns et al. | 429/90 |
| 5,321,627 | 6/1994 | Reher | 364/483 |
| 5,349,535 | 9/1994 | Gupta | 364/483 |
| 5,495,908 | 3/1996 | Obara et al. | 180/65.8 |

*Primary Examiner*—Emanuel T. Voeltz
*Assistant Examiner*—Hien Vo
*Attorney, Agent, or Firm*—Margaret A. Dobrowitsky

[57] ABSTRACT

A battery monitoring system for an electric vehicle is provided in which an individual battery monitor is physically touching and electrically connected to each one of the battery modules in the string of series or parallel connected battery modules. The battery monitors are themselves connected in a series loop with a central computer via optical communication links such that when the central computer issues a command to force instantaneous battery parameter readings, data from a battery monitor upstream in the series loop is transmitted via an optical communication link to the next battery monitor downstream and ultimately back to the central computer. The central computer utilizes the battery parameter data thus collected to determine various battery charge and fault conditions.

17 Claims, 7 Drawing Sheets

5,619,417

BATTERY MONITORING SYSTEM FOR AN ELECTRIC VEHICLE

FIELD OF THE INVENTION

This invention relates to a system that monitors physical parameters, such as voltage and temperature, of a series of battery modules in an electrical vehicle. More particularly, the invention relates to a battery monitoring system with a central computer in which an individual battery monitor is physically touching and electrically connected to each one of the battery modules in the string of series or parallel connected battery modules and in which the battery monitors themselves are interconnected via optical communication links with each other and with the central computer.

BACKGROUND

Electric vehicles typically have many large battery modules connected in series or in parallel to form a single large battery system. Electrical characteristics of these electric vehicle battery systems, such as temperature and voltage, conventionally are monitored using thermocouples and metal wires interconnected to a large central multiplexing unit. Interconnecting with metal wires the many components of these systems proves disadvantageous because of the increased risk of electrical shorts that results from a high degree of wiring complexity. In fact, containment of as few conductors as possible in the high-voltage battery compartment is desirable. Interconnection of a large number of electrical components with metal wires so as to increase system weight and volume also proves disadvantageous in electrical vehicle applications where the size of the battery system has been expanded thereby creating tight packaging constraints.

Therefore, to reduce the complexity of the central multiplexing equipment and the risk of electrical shorts, and to improve the reliability and manufacturability of the battery monitoring system, a self-contained battery monitoring system for electric vehicles is desired having individual monitors attached to each series or parallel-connected battery module in the system and interconnected with optical fibers to a central computer.

SUMMARY OF THE INVENTION

A system and method for managing a plurality of interconnected battery modules is provided in which a separate battery monitor is in electrically operable and close spacial relation to each one of a plurality of battery monitors to detect physical parameters of that battery. The battery monitors are themselves physically interconnected with optical communication transmission paths to a central computer that communicates command data to and receives physical parameter data from the battery monitors to determine the status of the battery modules. The described method includes the steps of augmenting the physical data collected for each battery monitored to any physical data received from a preceding battery monitor in the series loop then transmitting via the optical transmission path this augmented data in a data stream to the next battery monitor in the loop and eventually to the central computer.

DETAILED DESCRIPTION OF THE PREFERRED EMBODIMENT

Figure 1:
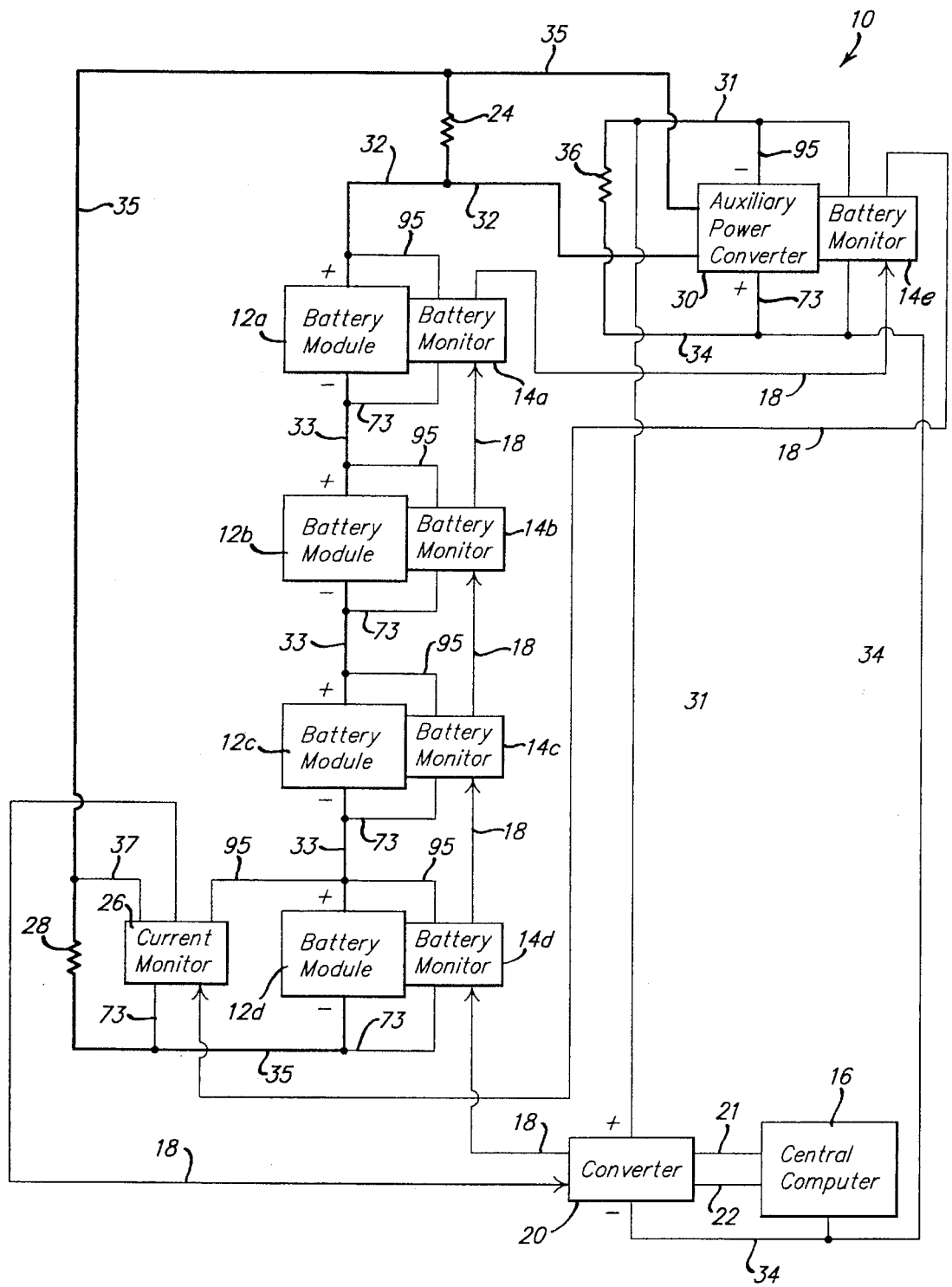
FIG. 1 is a functional block diagram depicting the battery monitoring system for an electric vehicle of the present invention.

Referring now to the drawings wherein like components among the several views are indicated by the same numeral, FIG. 1 depicts the preferred embodiment of the battery monitoring system of the present invention generally indicated by the numeral 10. A string of series-connected battery modules 12d–12a are connected in series via high voltage conductors 32, 33 and 35 with a main load resistance 24, such as a traction motor, and a shunt resistance 28. In the preferred embodiment, the shunt resistance is a 500 A/50 mV shunt comprising a predetermined length of the high voltage minus conductor 35. A battery monitor 14d–14a is physically touching and electrically connected via ground and raw voltage conductors, 73 and 95 respectively, to each one of the battery modules, 12d–12a respectively. The battery monitors 14d–14a are also interconnected in a series loop via optical communication links 18 with a central computer 16. In the preferred embodiment the central computer 16 is a laptop computer, however, the vehicle charging controller, the chassis controller, or a datalogger could also be used as the central computer 16.

A current monitor 26 is connected in parallel across the shunt resistance 28 via the shunt sensing and ground conductors, 37 and 73 respectively. The current monitor 26 receives power from its parallel connections across the first battery module 12d in the series loop via the shunt sensing and raw voltage input conductors, 37 and 95 respectively. The current monitor 26 determines the current characteristics of the system 10 by sensing the voltage difference across the shunt sensing conductor 37 and the ground conductor 73.

An auxiliary power converter 30 is connected in parallel across the main load resistance 24 via the high voltage and high voltage minus conductors, 32 and 35 respectively. A battery monitor 14e is in physical contact with the auxiliary power converter 30. This battery monitor 14e is also electrically connected to the auxiliary power converter 30 via the raw voltage input and low voltage plus conductors, 95 and 31 respectively, and via the ground and low voltage minus conductors, 73 and 34 respectively. Connected across the auxiliary power converter 30 are auxiliary load resistances 36 such as headlamps, radios, and cooling fans. In the preferred embodiment, the auxiliary power converter 30 is a Vicor model #VIN 62-CO02, which is attached to an oil-cooled cold plate.

Figure 2:
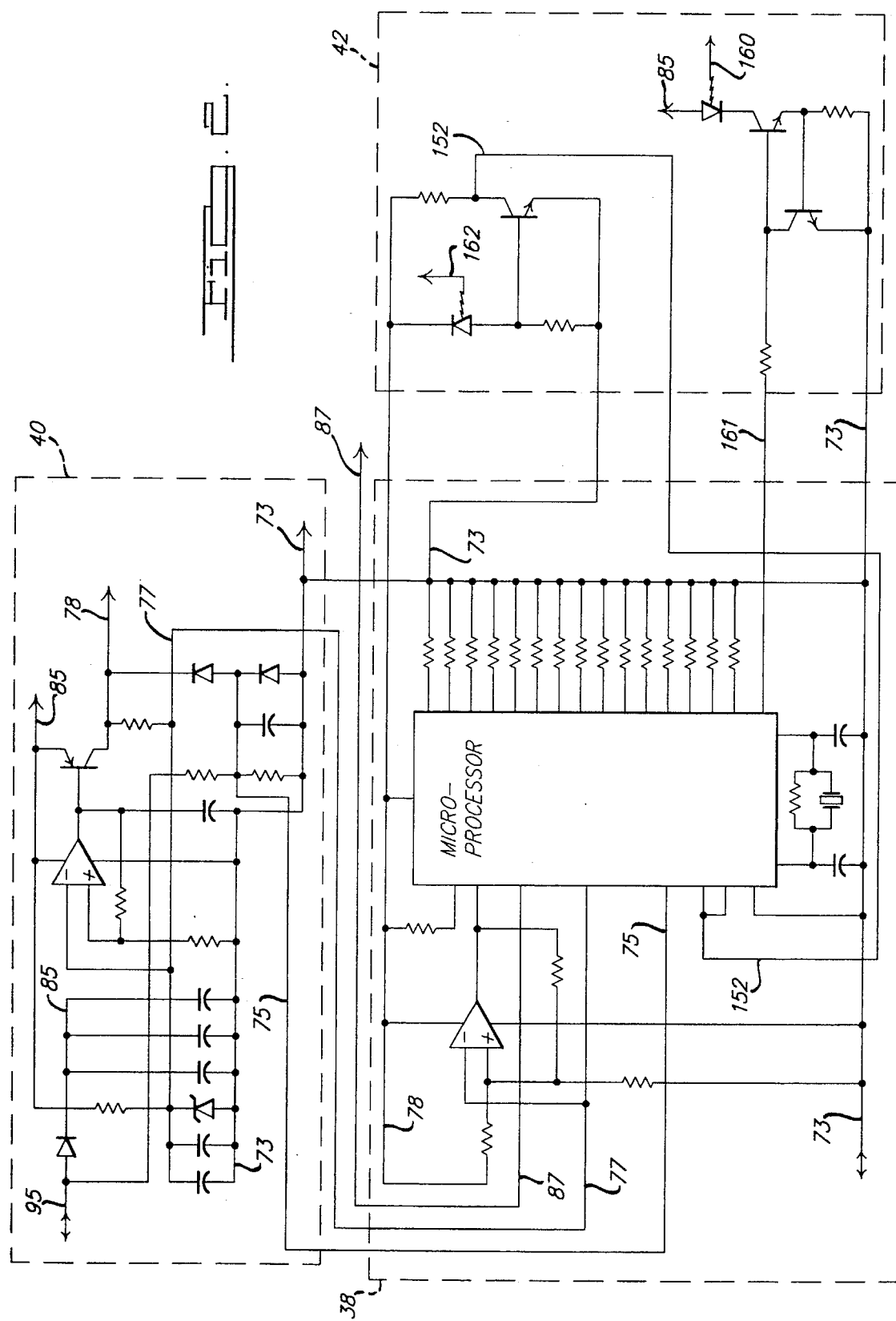
FIG. 2 is a circuit diagram of the common monitor portion of the battery and current monitors depicted in FIG. 1.

Referring now to FIG. 2, the common monitor portion of the battery and current monitors depicted in FIG. 1, 14e–14a and 26 respectively, is shown. The common portion of these monitors 14e–14a and 26 comprises a main processor section 38 connected to a power supply interface 40 and to transceiver section 42.

Figure 5:
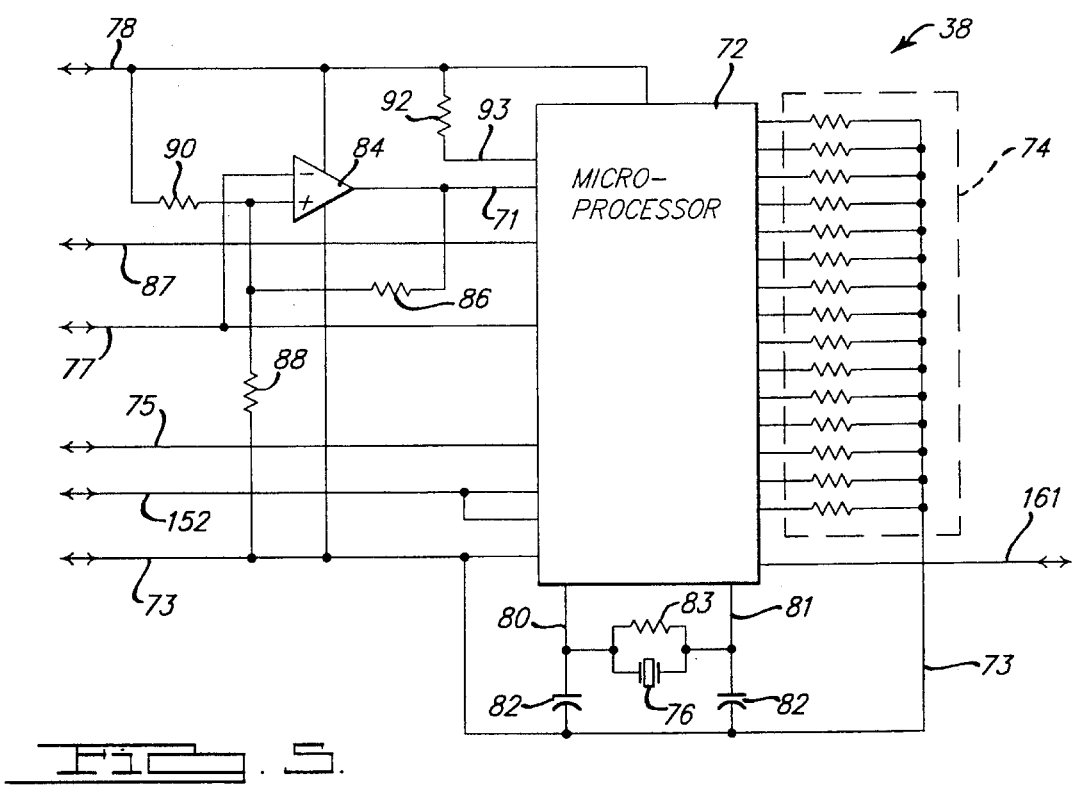
FIG. 5 is a circuit diagram of the processor section of the common monitor portion depicted in FIG. 2.

As shown in FIG. 5, the processor section 38 includes a microprocessor 72 that is powered through connection to the supply and ground conductors, 78 and 73 respectively. In the preferred embodiment, the microprocessor 72 is a Motorola model MC68HC05P9. The unused in/output port pins of the microprocessor 72 are electrically connected to the ground conductor 73 through a pulldown resistor array 74. The pulldown resistor array 74 prevents these unused pins from floating. In the preferred embodiment, the value of the pulldown resistor array is 10K.

Connected to the reset input 71 of the microprocessor 72 is the output of a reset comparator 84. The reset comparator 84 is powered through connections to the logic supply and ground conductors, 78 and 73 respectively. Until the system voltage is high enough for stable operation of the microprocessor 72, the reset comparator 84 maintains the microprocessor 72 in a reset mode. The positive input of the reset comparator 84 is connected at the junction of the pullup and pulldown resistors, 90 and 88 respectively, which form a reset comparator voltage divider between the supply conductor 78 and the ground conductor 73. The negative input of the reset comparator 84 is connected to the full scale analog voltage reference conductor 77. A reset comparator feedback resistor 86 is connected between the junction of the reset comparator voltage divider 88/90 and the output of the reset comparator 84. The reset comparator voltage divider 90/88 in conjunction with the full scale analog voltage reference conductor 77 sets a threshold supply voltage of 3 V (6/5 of 2.5 V) needed to trigger output from the comparator 84 and, in so doing, switch the microprocessor 72 out of reset mode.

To prevent IRQ interrupts, an IRQ input pullup resistor 92 is connected between the supply conductor 78 and the IRQ input pin 93 of the microprocessor 72. A system clock frequency is provided in the battery and current monitors, 14e–14a and 26 respectively, by a crystal 76 and a resistor 83 connected in parallel between the OSC1 and OCS2 pins, 80 and 81 respectively, of the microprocessor 72 and a matched pair of capacitances 82 each connected between the OSC1 and OSC2 pins, 80 and 81 respectively, and the ground conductor 73.

The microprocessor 72 receives serial data from the transceiver section 42 via the receive conductor 152 and transmits serial data to the transceiver section 42 via the transmit conductor 161. The microprocessor 72 senses the analog temperature of its battery module 14, or alternatively the current characteristic of the system 10, via the measurement conductor 87 of its thermal or current interface, 44 or 60 respectively. Supply voltage analog data is sensed by the microprocessor 72 through the voltage measurement conductor 75 of the power supply interface 40. Finally, the microprocessor 72 senses the full scale analog voltage, which it uses to scale all its other analog inputs, via the full scale analog voltage reference conductor 77.

Figure 6:
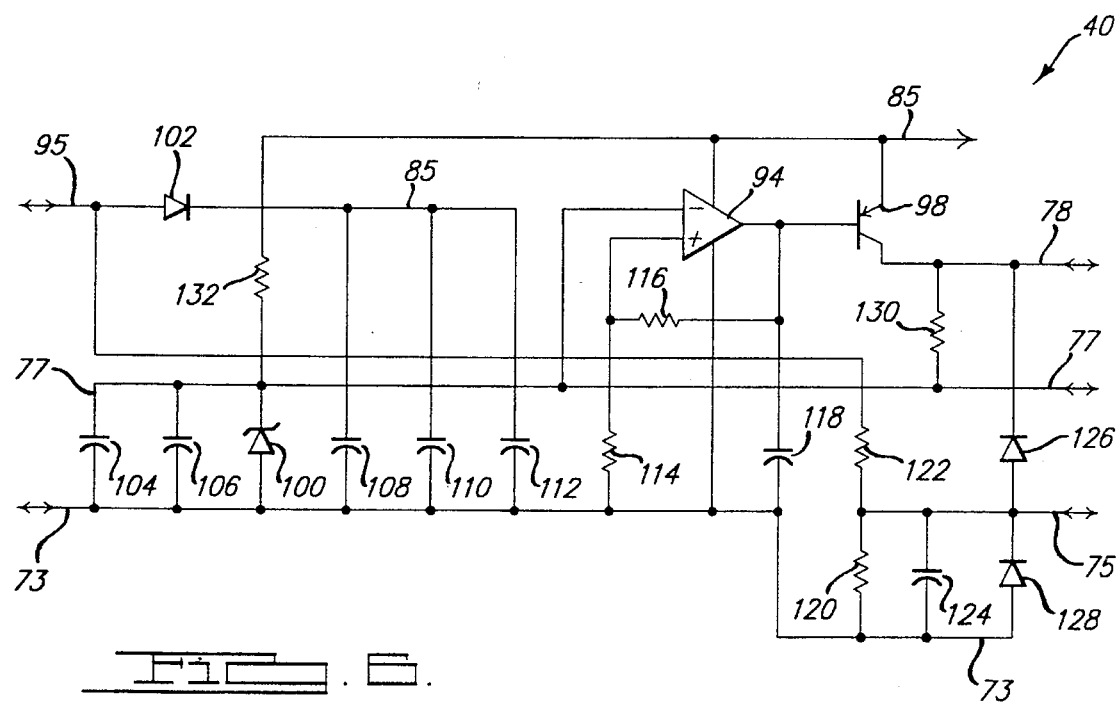
FIG. 6 is a circuit diagram of the power supply interface of the common monitor portion depicted in FIG. 2.

Referring now to FIG. 6, the power supply interface 40 is comprised of two low frequency filtering capacitors 104 and 106 connected in parallel between the ground conductor 73 and the full scale analog voltage reference conductor 77. Connected in parallel with the low frequency filtering capacitors 104 and 106 is a voltage reference zener diode 100. A reference pullup resistor 132 is connected in series with the voltage reference zener diode 100 between the ground conductor 73 and the analog supply conductor 85. A reverse voltage protection diode 102 is connected between the raw voltage input 95 and the analog supply conductor 85 to protect the battery or current monitor, 14 or 26 respectively, from reverse polarity connections. Connected between the ground connector 73 and the analog supply conductor 85 are three high frequency filtering capacitors 108, 110 and 112, which filter the analog supply voltage 85 against transients and provide current during short dropout periods.

A base drive amplifier 94 in the power supply interface 40 is powered through its connections to the analog supply conductor 85 and the ground conductor 73. The analog supply conductor 85 supplies current to the base drive amplifier 94 and, through a power supply transistor 98, to the logic supply conductor 78. The inverting input of base drive amplifier 94 is connected to the full scale analog reference conductor 77. The non-inverting input of base drive amplifier 94 is connected through a non-inverting input resistor 114 to the ground conductor 73. Connected between the non-inverting input and the output of the base drive amplifier 94 is a positive feedback resistor 116. Together, the non-inverting input and positive feedback resistors, 114 and 116 respectively, configure the base drive amplifier 94 as a comparator that energizes the base of the power supply transistor 98 when the voltage of the logic supply conductor 78 falls below 3.125 V (5/4 of 2.5 V).

The emitter of the power supply transistor 98 in the power supply interface 40 is connected to the analog supply conductor 85 while its 40 collector is connected to the logic supply conductor 78. The power supply transistor 98 operates in its linear region to energize the logic supply voltage conductor 78. A power supply bias resistor 130 is connected between the logic supply conductor 78 and the full scale analog reference conductor 77. An output filter capacitor 118 is connected between the output of the base driver amplifier 94 and the ground conductor 73 to filter high frequency noise from the output of the base driver amplifier 94. Finally, a voltage divider comprised of measurement voltage divider pullup and pulldown resistors, 122 and 120 respectively, is connected between the raw voltage input 95 and the ground conductor 73. Connected in parallel with the measurement voltage divider pulldown resistor 120 is a measurement voltage filter capacitor 124 which filters noise from the measurement signal on the voltage measurement conductor 75. Positive and negative measurement clamping diodes, 126 and 128 respectively, are connected between the logic supply conductor 78, the voltage measurement conductor 75, and the ground conductor 73 to clamp the measurement signal on the voltage measurement conductor 75 between the two supply rails, i.e. the logic supply conductor 78 and the ground conductor 73.

Figure 7:
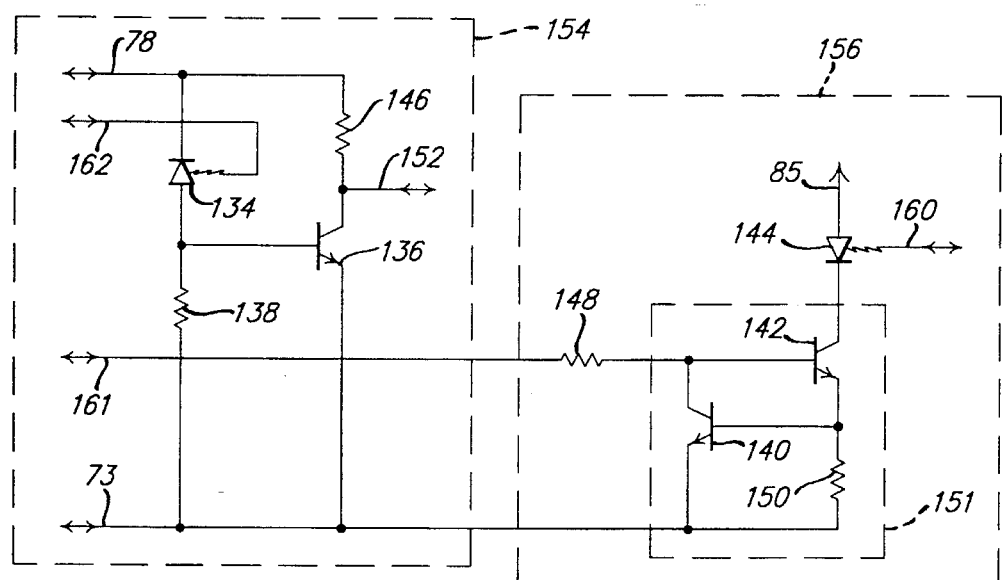
FIG. 7 is a circuit diagram of the transceiver section of the common monitor portion depicted in FIG. 2.

Referring now to FIG. 7, the transceiver section 42 is comprised of a receiver section 154 connected to a transmitter section 156. The receiver section 154 converts optical data received via the optical input fiber 162 into electrical digital data for input to the microprocessor 72 via the receive conductor 152. The receiver section 154 is comprised of a receiver photo diode 134 connected between the logic supply conductor 78 and the ground conductor 73 in series with a receiver pulldown resistor 138. Connected between the logic supply conductor 78 and the ground conductor 73 in series with a pullup resistor 146 is a normally-off receiver switching transistor 136 whose base is connected at the junction of the receiver photo diode 134 and the receiver pulldown resistor 138. The receiver switching transistor 136 remains in its off or non-conducting state until the receiver photo diode 134 receives light on its optical input fiber 162 and begins to conduct, thereby raising the base voltage of the receiver switching transistor 136 to turn it on. The pullup resistor 146 connected to the collector of the receiver switching transistor 136 ensures that the inactive state of the receiver switching transistor 136 is a logical one such that microprocessor 72 receives a logical "one" on the receive conductor 152 to denote inactivity and logical "zero" to denote activity.

The transmitter section 156 converts the digital data output it receives from the microprocessor 72 into optical data for transmission via the optical output fiber 160 to the central computer 16. Thus, each optical communication link 18 in the series connected battery and current monitors, 14e–14a and 26 respectively, depicted in FIG. 1 is comprised of both optical output and optical input fibers, 160 and 162 respectively. Further, the optical output fiber 160 of each battery monitor 14 in the series connection 14d–14a and 14e is the optical input fiber 162 to the subsequent battery or current monitor, 14 or 26 respectively, in the series connection.

The transmitter section 156 includes a constant current source 151 comprising an interconnected pair of transmitter transistors 140 and 142. The collector of the first transmitter transistor 140 is connected to base of the second transmitter 142 and to the transmit conductor 161 through the transmitter resistor 148. The emitter of the first transmitter 140 is connected to the ground conductor 73. The second transmitter transistor 142 is enabled by current flowing through the transmit conductor 161 via the transmitter resistor 148. Connected between the collector of the second transmitter transistor 142 and the analog supply conductor 85 is a transmitter photo emitter diode 144. A transmitter current limiting resistor 150 connected between the emitter of the second transmitter transistor 142 and the ground conductor 73 limits the current, when present, through the photo emitter diode 144. In the preferred embodiment, this current is limited to 60 mA. Thus, a "zero" is output on the optical output fiber 160 in response to microprocessor 72 outputting a "one" via the transmit conductor 161. A "one" on the transmit conductor 161 causes the constant current source 151 to sink 60 mA through the transmitter photo emitter 144, which outputs infrared light into the optical output fiber 160. Infrared light on the optical output fiber 160 causes the next monitor 14 or 26 in the string of series-connected battery or current monitors, 14a–14d or 26 respectively, to see a "zero" on its receive conductor 152. Thus, while received data is not inverted as input to the microprocessor 72, the microprocessor 72 does invert its output transmission data.

Figure 3:
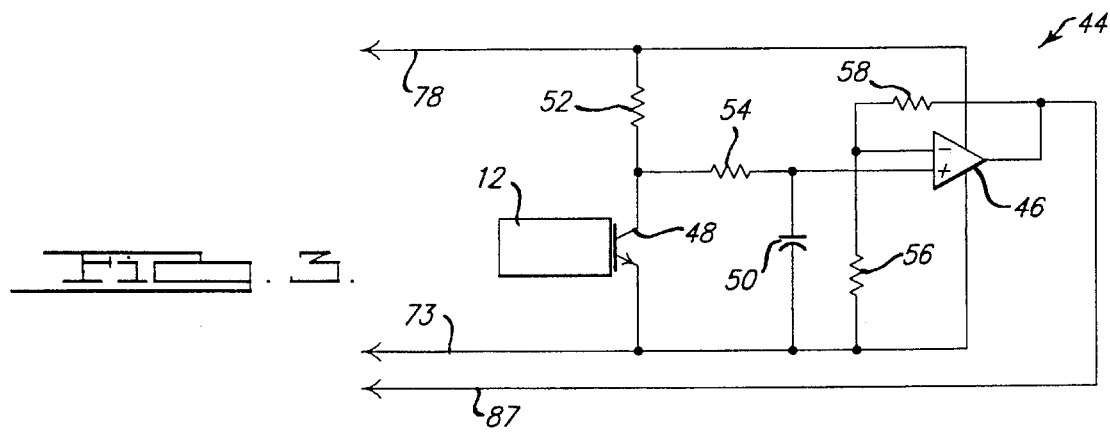
FIG. 3 is a circuit diagram of the thermal interface for the battery monitor depicted in FIG. 1.

Referring now to FIG. 3, the thermal interface 44 of each battery monitor 14a–14d is comprised of a thermal sensing transistor 48 in physical contact with each one of the battery modules 12a–12d, respectively. The emitter of the thermal sensing transistor 48 is connected to the ground conductor 73. The collector of the thermal sensing transistor 48 is connected through a pullup resistor 52 to the logic supply conductor 78. The collector of the thermal sensing transistor 48 is also connected through an input resistor 54 to the non-inverting input of a thermal interface amplifier 46. This thermal interface amplifier 46 is powered through its connections to the logic supply conductor 78 and the ground conductor 73. An input filtering capacitor 50 is connected between the non-inverting input of the thermal interface amplifier 46 and the ground conductor 73. In the preferred embodiment, the values for the input filtering capacitor 50 and the input resistor 54 are 0.1 uF and 10K, respectively, the combination setting up a low pass filter with a RC time constant of 1 millisecond. Connected between the inverting input and the output of the thermal amplifier 46 is a feedback resistor 58. Finally, an inverting input resistor 56 is connected between the inverting input of the thermal amplifier 46 and the ground conductor 73. In the preferred embodiment, the values of the amplifier feedback resistor 58 and the inverting pulldown resistor 56 are chosen such that a gain of 2.21 is set for the thermal amplifier 46. Thus, the thermal interface 44 senses the temperature of the battery module 14 via the thermal sensing transistor 48 then amplifies this analog voltage representing the measured temperature for output via the temperature measurement conductor 87 to the microprocessor 72.

Figure 4:
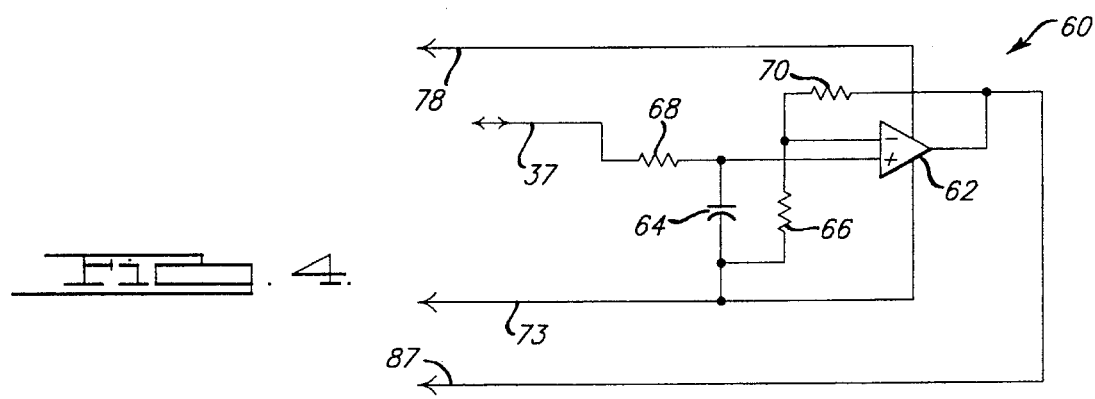
FIG. 4 is a circuit diagram of the current interface for the current monitor depicted in FIG. 1.

Referring now to FIG. 4, the current interface 60 is comprised of a current interface amplifier 62, which is powered through connections to the logic supply conductor 78 and the ground conductor 73. The non-inverting input of the current interface amplifier 62 is connected to the shunt sensing conductor 37 through a non-inverting input resistor 68. An input filtering capacitor 64 is connected across the non-inverting input of the current amplifier 62 and the ground conductor 73 between the non-inverting input resistor 68 and the non-inverting input of the current interface amplifier 62. In the preferred embodiment, the values for input filtering capacitor 64 and the non-inverting input resistor 68 are 0.1 uF and 10K, respectively, setting up a low pass filter with an RC time constant of 1 millisecond for the series connection. A current amplifier feedback resistor 70 is connected between the inverting input and the output of the current interface amplifier 62. An inverting input resistor 66 is connected between the inverting input of the current amplifier 62 and the ground conductor 73. In the preferred embodiment, the values of the feedback resistor 70 and the inverting input resistor 66 are chosen such that a gain of 60 is set for the current amplifier 62. Finally, the output of the current interface amplifier 87 is connected to the current measurement conductor 87. Thus, the current interface 60 measures the system current by sensing the voltage across the shunt resistor 28 via the shunt sensing conductor 37 then amplifies this signal for output via the current measurement conductor to the microprocessor 72.

Figure 8:
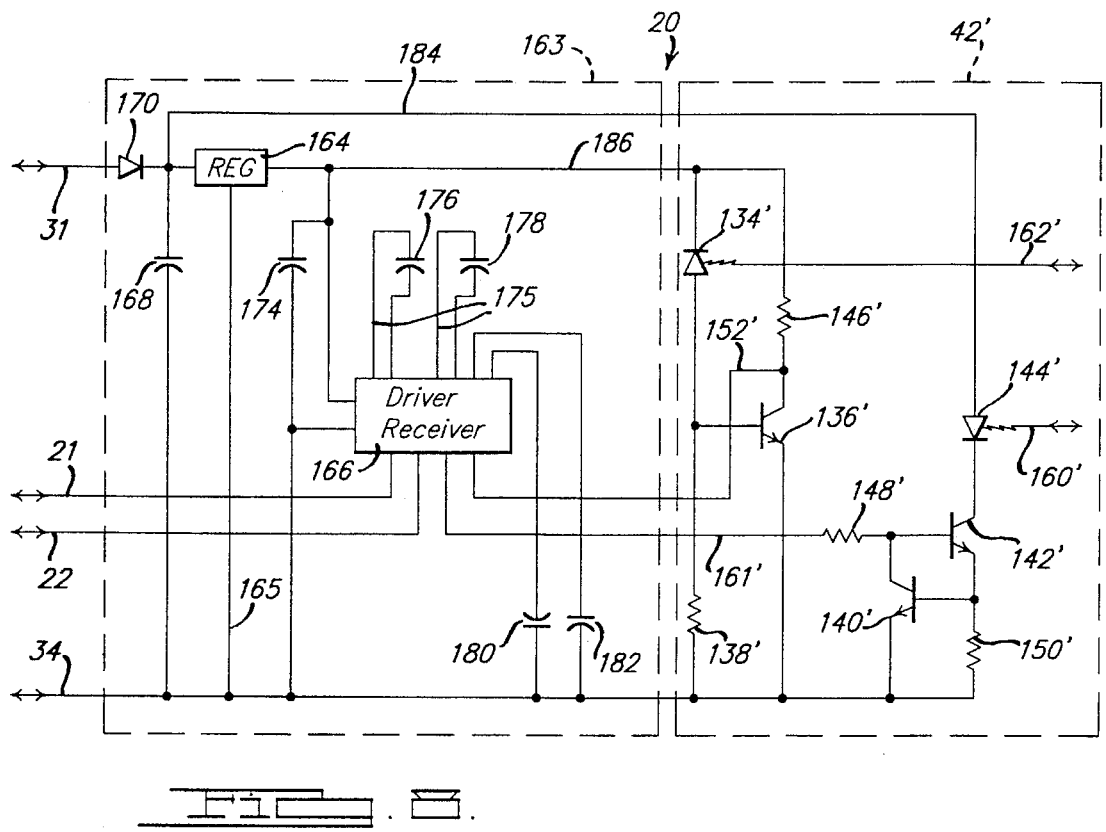
FIG. 8 is a circuit diagram of the optical to RS232 converter depicted in FIG. 1.

Referring now to FIGS. 1 and 8, the optical to RS232 converter 20 contains a line driver receiver section 163 connected to a transceiver section 42'. The architecture and operation of the transceiver section 42' is as described above for the transceiver section 42. The line driver receiver section 163 contains an off-the-shelf MAX232 converter line driver receiver chip 166 and an off-the-shelf MC7805 voltage regulator 164. Although the converter line driver receiver chip 166 has two on-board dc-to-dc converters and four on-board level shifters, only two level shifters are used in the present application.

The voltage regulator 164 is powered through its connections to the low voltage plus and minus conductors, 31 and 34 respectively. The voltage regulator 164 is connected to the low voltage minus conductor 34 via the regulator ground conductor 165, while its input pin is connected to the low voltage plus conductor 31 through a reverse blocking diode 170. The reverse blocking diode 170 protects the optical to RS232 converter 20 from damage that could result from reverse connection of its power leads 31 and 34. Connected at the junction of the reverse blocking diode 170 and the converter voltage regulator 164 via a converter analog supply conductor 184 is a converter transmitter photo emitter diode 144' whose operation is detailed in the description of the transceiver section 42. To reduce the high frequency noise reaching the converter voltage regulator, a regulator input filter capacitor 168 is connected between the low voltage minus conductor 34 and the converter analog supply conductor 184.

The converter voltage regulator 164 outputs 5 V power via its converter logic supply conductor 186 to the inputs of the converter line driver receiver chip 166 and the receiver photo diode 134'. To reduce the high frequency noise from the converter voltage regulator 164 reaching the input of the line driver receiver chip 166, a power supply filter capacitor 174 is connected between the output of the converter voltage regulator 164 and the low voltage minus conductor 34. Trim capacitors 176 and 178 are each connected in across two of the four trim pins 175 of the converter line driver receiver chip 166. Two storage capacitors 180 and 182, which store the main charge for the two on-board dc-to-dc converters, are connected between the converter line driver-receiver chip 166 and the low voltage minus conductor 34.

The 5 V logic level transmit pin of the converter line driver receiver chip 166 is connected to the transceiver transmit resistor 148'. The 5 V logic level receive pin of the line driver-receiver chip is connected between the collector of a receiver switching transistor 136' and the pullup resistor 146'. These connections enable the line driver chip 166 to convert RS232 signals received from the central computer 16 via the RS232 transmit conductor 21, which range from −10 V to +10 V to the 0 V, to the +5 V logic level required by the transceiver section 42. The transceiver section 42' then converts the 5 V logic level data to optical data for transmission to the battery monitors 14 via the optical output fiber 160'(18). Conversely, the transceiver section 42' receives optical signals received from the battery monitors 14 via its optical input fiber 162'(18). These optical signals are converted to 5 V logic level signals and input to the converter line-driver receiver chip 166. The converter line-driver receiver chip 166 converts these 5 V logic level signals to RS232 signals for transmission via the RS232 receive conductor to the central computer 16. Thus, the optical to RS232 converter 20 provides full duplex communication between a standard IBM-PC compatible computer, or other device having a standard RS232 Com port such as a Campbell Scientific Datalogger Storage Module, and the string of series connected battery and current monitors, 14 and 26 respectively.

Figure 11A:
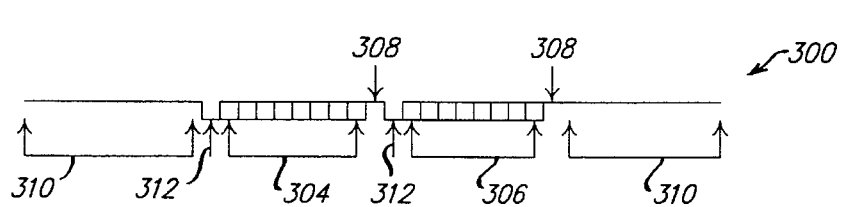
FIG. 11A is a bit map of the packet format for a single battery monitor shown in FIG. 1.

Referring now to FIG. 11A, a bit map outlining the format for a data packet 300 from a single battery monitor is shown. In the preferred embodiment, one data packet 300 comprises two data bytes 304 and 306. The voltage data byte 304 is transmitted first and appears on left side of FIG. 11A while the temperature data byte 306 is transmitted last and appears on the right. In the case of a current monitor 26, data bytes 304 and 306 both contain current data. The inactive state of the transmitter photo emitter diode 144 depicted in FIG. 7 is a logical "one," which is shown as the upper signal level denoted by numeral 308 in FIG. 11A. The active state of the transmitter photo diode 144 is a logical "zero," which is shown as the lower signal level denoted by numeral 312. Such a protocol in which a logical one represents the inactive state and a logical zero represents the active state is known in the industry as a "non-return-to-zero" (NRZ) protocol. One advantage in using a NRZ protocol is that little current is required to operate the diode 144 in its inactive or idle transmission state.

Thus, the series of data bytes 304 and 306 comprising the data packet 300 represents the voltage and temperature or current information gathered by either the battery or current monitors, 14 or 26, through the thermal or current interfaces, 44 or 60 respectively. Each data byte 304 and 306 is preceded by a start bit 312, which is represented by an active transmission state or logical zero. Note that each data byte 304 or 306 is followed by a stop bit 308, which is denoted by an inactive transmission state or logical one.

Figure 11B:
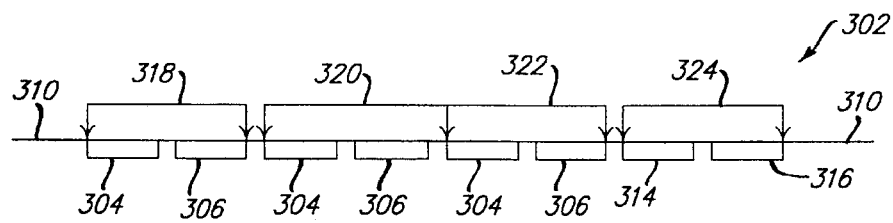
FIG. 11B is a byte map of the packet protocol for the data stream produced in an example battery monitor system having two interconnected battery monitors, an auxiliary power converter, and a current monitor.

Referring now to FIG. 11B, a stream of data bytes 302 is shown wherein the last data byte 316 is also followed by an inactive or idle period 310 represented by a logical "one" of at least 10 bits. The data stream depicted respects a protocol in which the first battery monitor 14d in the series connected string transmits a data packet 300 including two data bytes 304 and 306 and one start and stop bit, 312 and 308 respectively. Each subsequent battery and current monitor 14c, 14b, 14a, 14e and 26, in the string of series connected monitors receives a data packet 300 from its immediately preceding monitor 14a-e, appends its own data packet 300 to its received data packet 300, then transits this augmented data stream 302 to the next battery or current monitor, 14 or 26 respectively, in the string.

A map outlining the format of such a data stream 302 is shown in FIG. 11B for a system 10 monitoring a series connection of two battery modules 12, an auxiliary power converter 30, and a shunt resistance 28. The data packet 318 transmitted first appears on left side of FIG. 11B, while data packet 324 transmitted last appears on the right. The first packets 318 and 320 received by the central computer 16 contain voltage and current information transmitted from the two battery monitors 14 connected first in the series. The third packet 322 received by the central computer 16 contains voltage and temperature information transmitted from the auxiliary power converter 30. Finally, the last packet 324 received by the central computer 16 contains system current information transmitted by the current monitor 26.

Figure 9:
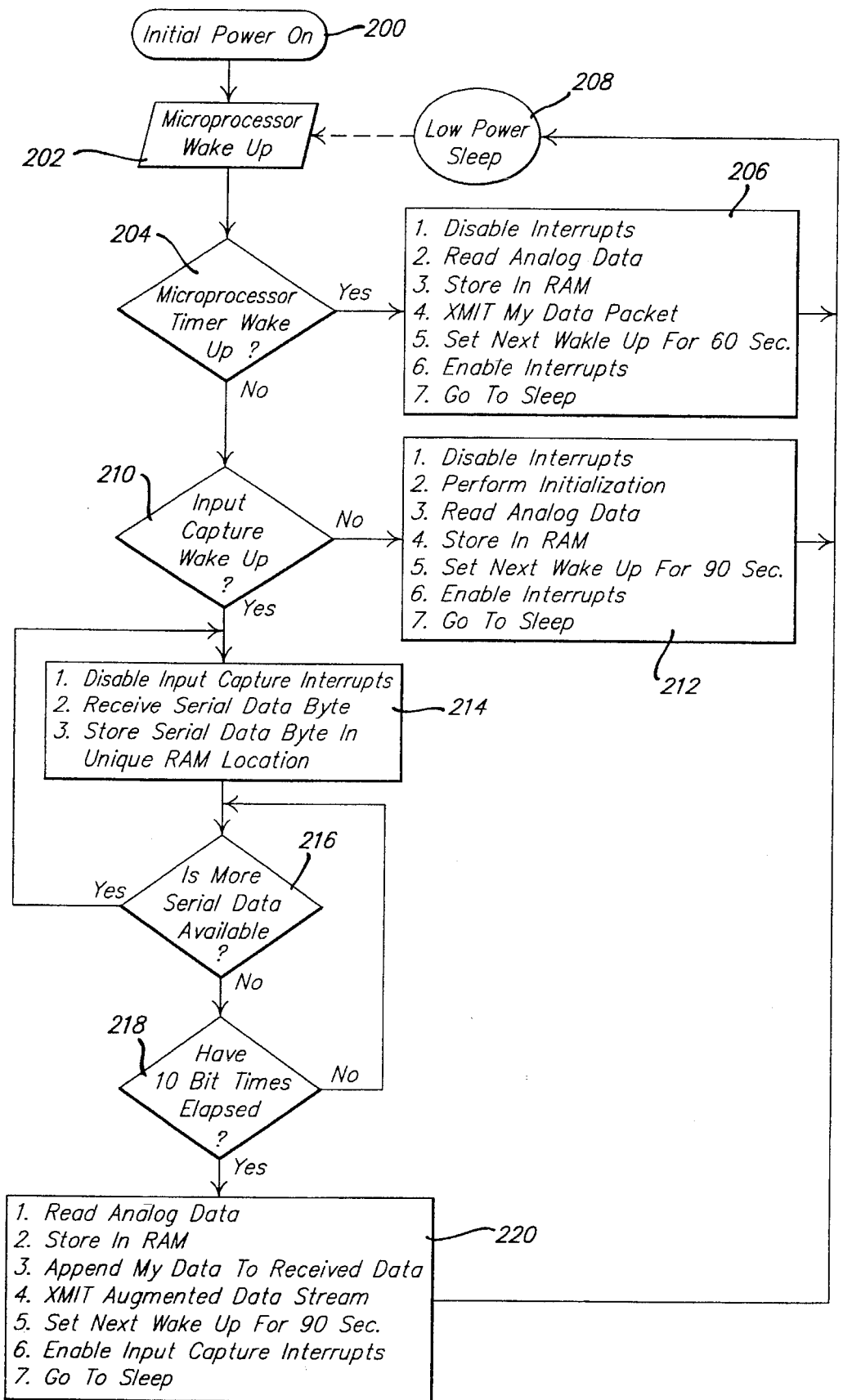
FIG. 9 is a flowchart depicting the method of operation of the battery and current monitors depicted in FIG. 1.

Referring now to FIG. 9, the method of operation of a single battery monitor 14 depicted in FIG. 1 is outlined as a flowchart. This method begins in step 200 when power to the battery monitor 14 is turned on by connecting the conductors 95 and 73 across any battery module 12 or auxiliary power converter 30 that supplies current sufficient to power the supply interface 40 shown in FIGS. 2 and 6. In response, the reset input 71 of the processor section 38 goes high causing the microprocessor 72 to come out of reset mode. In step 202, the microprocessor 72 wakes up and branches to the first instruction in its application or user program.

In step 204, if the timer flag internal to the microprocessor 72 is set, the user program concludes that the wake-up was due to the expiration of the on-board wake-up timer and the user program branches to the wake-up timer service routine of step 206 in which the microprocessor 72 proceeds to: 1) disable interrupts via the IRQ input/output pin 93; 2) read the analog data consisting of the temperature and voltage present on the temperature and voltage measurement conductors, 87 and 75 respectively; 3) store these values in the microprocessor's 72 RAM; 4) transmit using a "bit banging" technique the inverted or one's complement of this parameter data via its transmit conductor 161 for output on the optical output fiber 160/18 to the next battery monitor 14 in the series connected loop; 5) set its on-board wake-up timer to wake-up again in 60 seconds; 6) enable interrupts via the IRQ input/output pin 93; then 7) go into the low power sleep mode denoted in step 208. "Bit banging" is used in the present invention because the microprocessor 72 does not provide an onboard asynchronous serial port. "Bit banging" is a technique well known in the industry by which a microprocessor receives or transmits serial data bit by bit.

In step 204, if the timer flag internal to microprocessor 72 is not set, the microprocessor 72 concludes that its wake-up was not due to the expiration of the on-board wake-up timer. The microprocessor 72 proceeds in step 210 to check its input capture flag to determine whether the wake-up was due to the receipt of serial data. If the microprocessor 72 finds in step 210 that its input capture flag is not set such that it has not received serial data on the receive conductor 152, it concludes by a process of elimination that the initial power-on wake-up is occurring. The user program running in the microprocessor 72 then branches to the initialization routine of step 212 wherein the microprocessor 72 proceeds to: 1) disable interrupts via the IRQ input conductor 93; 2) perform initialization of all registers and parameters; 3) read the analog data consisting of the temperature and voltage present on the temperature and voltage measurement conductors, 87 and 75 respectively; 4) store these values in the microprocessor's 72 RAM; 5) set its on-board wake-up timer to wake-up again in 90 seconds; 6) enable interrupts via the IRQ input/output pin 93; 7) then go into the low power sleep mode denoted in step 208. Note that the low power sleep period is set at initial wake-up in step 212 for 90 seconds but that all subsequent low power sleep periods are set in step 206 for 60 seconds.

If the internal input capture flag is set in step 210, the microprocessor 72 concludes that it is receiving serial data via its receive conductor 152. The user program running in the microprocessor 72 proceeds to the serial data service routine outlined in step 214 wherein the microprocessor 72 proceeds to: 1) disable input captures interrupts, which occur in response to data being received via the receive conductor 152, to preclude receipt of further timer and input capture interrupts and prevent the microprocessor 72 from erroneously branching to step 202; 2) receive using a "bit banging" technique a serial data byte via the optical input fiber 162 and the receive conductor 152; and 3) store the data byte in a unique RAM address location to begin the formation of a received data packet.

In step 216, the microprocessor 72 continues to check its receive conductor 152 to see if more serial data is available. If more serial data is available, the user program running in the microprocessor 72 continues to process the subsequent serial data bytes received according to the serial data service routine of step 214. In step 216, if more serial data is not available on the receive conductor 152, the user program proceeds to an idle detection loop denoted as step 218 in FIG. 9. If ten bit times lapse in step 218 and no serial data is detected on the receive conductor 152, the microprocessor 72 assumes that the last data byte in the data stream 302 has been received. The user program running in the microprocessor 72 then proceeds to the serial data received conclusion routine outlined in step 220 in which it proceeds to: 1) read the analog data consisting of the temperature and voltage present on the temperature and voltage measurement conductors, 87 and 75 respectively; 2) store these values in the microprocessor's 72 RAM; 3) append these data to the received serial data to form the augmented data packet; 4) transmit using a "bit banging" technique the inverted or one's complement of this parameter data via its transmit conductor 161 for output on the optical output fiber 160/18 to the next battery monitor 14 in the series connected loop;

5) set its on-board wake-up timer to wake-up again in 90 seconds; 6) enables input capture interrupts, which occur in response to data received via the receive conductor 152; then 7) goes into the low power sleep mode denoted by step 208.

The operation of the current monitor 26 depicted in FIG. 1, which utilizes the current interface 60 of FIG. 4 in conjunction with the common monitor portion of FIG. 2, is identical to the operation of the battery monitor 14, as described above, except that the analog data read in steps 206, 212 and 220 are two bytes of voltage data corresponding to system current information sampled via the current measurement conductor 87 rather than the two bytes of voltage data corresponding to system voltage and temperature information read in the operation of the battery monitor.

Figure 10:
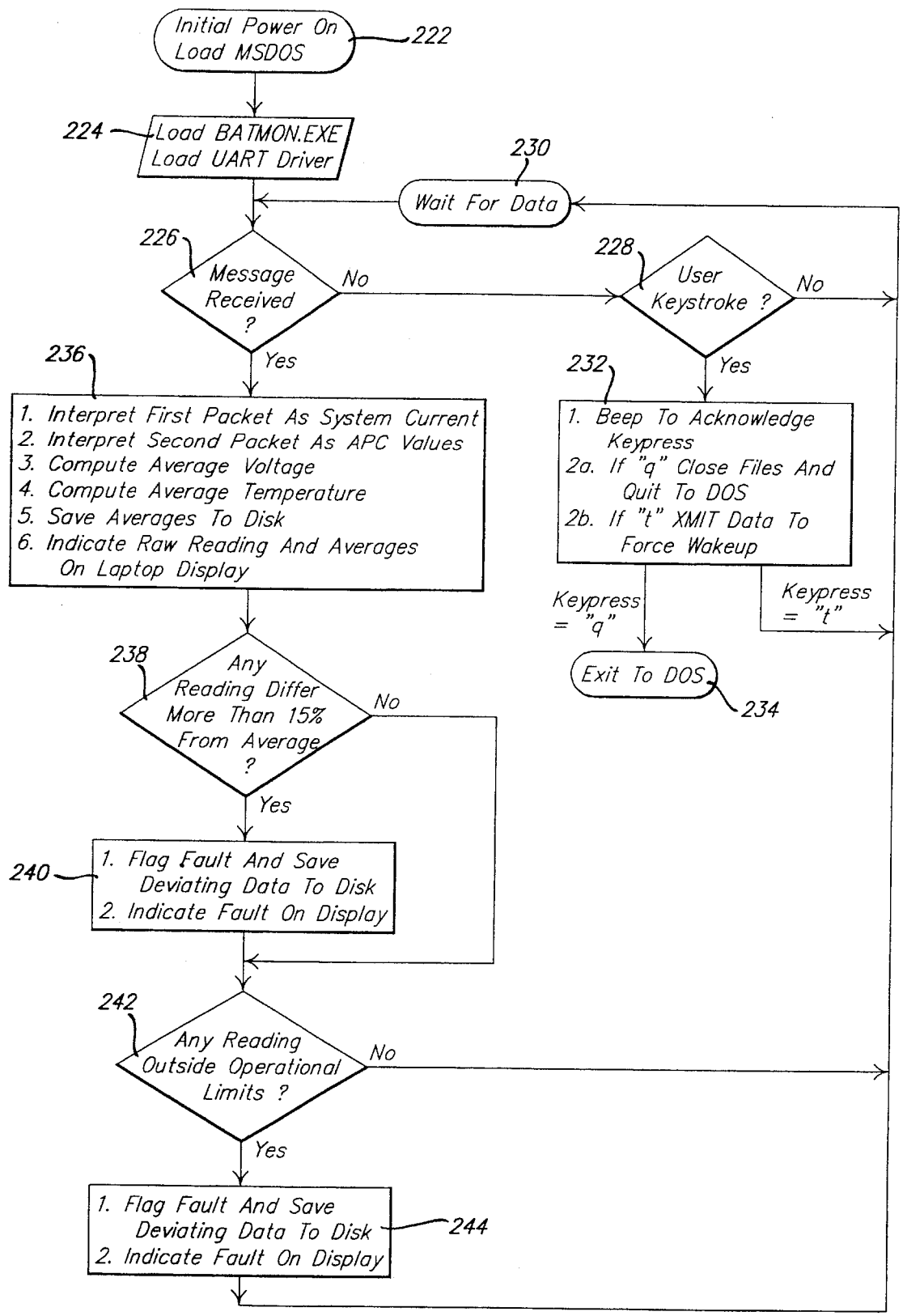
FIG. 10 is a flowchart depicting the method of operation of the central computer in the battery monitoring system depicted in FIG. 1.

Referring now to FIG. 10, the method of operation of the central computer 16 depicted in FIG. 1 is outlined as a flowchart. This method of operation begins in step 222 in which the central computer 16 is turned on causing MSDOS to be loaded into its RAM and the operating system environment established. In step 224, the program BATMON.EXE including the UART Driver module is executed to perform the steps described below. In step 226, the central computer 16 decides whether a message from the string of battery monitors 14 has been received via its RS232 transmit conductor 21. If such a message has not been received, in step 228 the central computer 16 looks for a user keystroke. If a user keystroke is not received, in step 230 the central computer 16 continues to wait for data.

If a user keystroke is received is step 226, the central computer 16 beeps to acknowledge receipt of the keystroke. If the keystroke is a "q," the central computer closes its actives files, quits the BATMON.EXE program and, in step 234, escapes to the MSDOS operating system. If the keystroke received is a "t," the central computer transmits data via the converter receive conductor 22 to force a wake-up of the battery monitor system 10. The central computer 16 then receives a message back from the string of battery monitors 14 in step 226.

In step 226, if a message is received from the string of battery monitors 14a–d, the central computer 16 proceeds in step 236 to: 1) interpret the first packet received as the system voltage and current; 2) interpret the second packet received as the Auxiliary Power Converter (APC) voltage and temperature values; 3) compute the average voltage and temperature for all the batteries 12 in the string; 4) save these averages to the disk of the central computer 16; and 5) output the raw readings and the averages to its output display. The central computer 16 then compares the raw readings for each battery 12 to the computed average for the string of battery modules 12d–12a.

If the raw readings differ from the computed average in step 238 by more than 15%, the central computer 16 proceeds in step 240 to: 1) flag the fault and save the deviating data to its disk; and 2) indicate the fault on its output display. If the raw readings for each battery module 12 do not deviate in step 238 from the computed average for the string of batteries 12a–d, the central computer 16 proceeds immediately to step 242 to determine whether any readings (i.e., battery voltage or temperature or auxiliary power converter voltage or temperature) are outside predetermined operational limits. In step 244, the central computer: 1) flags any readings outside operational limits and saves this deviating data to its disk; and 2) indicates the faults on its display. The method of operation of the central computer 16 then returns to step 226 in which it monitors whether a message from the string of battery monitors 14 has been received via the RS232 transmit conductor 21.

It may be apparent to one skilled in the art that twisted-pair or some other conductive medium could be used instead of optical fiber to form the communications links 18 between the various battery or current monitors. The battery and current monitors could also be constructed to utilize different microprocessors. Finally, the single-ended current monitor described in the present invention could be replaced by a bipolar design. Other modifications and alternative constructions will, of course, be apparent to those skilled in the art who should realize that such variations made to the disclosed embodiment may still properly fall within the scope of the present invention as defined by the claims which follow.

What I claim is:

1. A method for monitoring a physical parameter of at least two batteries in a string of connected batteries, comprising the steps of:

providing monitoring means, in operable relation to each one of the batteries, for monitoring the physical parameter, an optical transmission path in communication between said monitoring means, and transceiver means within each one of said monitoring means, for transmitting and receiving the physical parameter to and from said monitoring means;

augmenting the physical parameter of the battery being monitored to a received physical parameter; and transmitting said augmented physical parameter via said optical transmission path.

2. The method of claim 1, further comprising the step of:

assuming a low power state when no physical parameter is received each for a predetermined time period.

3. A system for managing at least two interconnected batteries in an electric vehicle, comprising:

at least two sensors, each one of said sensors in electrically operable relation with and in close spatial relation to one of the batteries, for sensing the voltage across the battery;

at least two local processors, each one of said local processors in electrically operable relation to one of said sensors, for processing said sensed voltage into voltage data;

at least two transceivers, each one of said transceivers in electrically operable relation to one of said local processors, for converting said voltage data into optical data;

a central processor, in optically operable relation to said transceiver, for communicating command data to said local processor, for receiving said voltage data from said local processor, and for determining the status of the batteries based on said voltage data; and an optical fiber, connecting in series each of one of said local processors and communicating with said central computer, for transporting said optical data between said local processors and said central computer.

4. The system of claim 3 wherein said plurality of batteries are electrically connected in a series loop.

5. The system of claim 4, further comprising:

a current monitor, in electrically operable relation to at least one of said plurality of batteries and in communication with said central processor, for collecting and processing data related to current from said series connection of batteries.

6. The system of claim 3, further comprising:

an auxiliary power converter, in electrically operable relation to at least one of said batteries and in communication with said central computer, for providing power to the system.

7. The system of claim 3, further comprising:

a converter, in electrically operable relation to said central computer and in optical communication with at least one of said plurality of transceivers, for converting data between optical and electrical forms.

8. A system for managing batteries in an electric vehicle, comprising:

at least two interconnected power supply means;

at least two sensing means, each one of said sensing means in electrically operable relation with and in close spatial relation to one of said power supply means, for sensing the voltage across said power supply means;

at least two local processing means, each one of said local processing means in electrically operable relation to one of said sensing means, for processing said sensed voltage into voltage data;

at least two transceiving means, each one of said transceiving means in electrically operable relation to one of said local processing means, for converting said voltage data into optical data;

central processing means, in optically operable relation to said transceiving means, for communicating command data to said local processing means, for receiving said voltage data from said local processing means, and for determining the status of said power supply means based on said voltage data; and optical communication means, connecting in series each of one of said local processing means and communicating with said central processing means, for transporting said optical data betwen said local processing means and said central processing means.

9. The system of claim 8 wherein said plurality of batteries are electrically connected in a series loop.

10. The system of claim 9, further comprising:

a current monitor, in communication with at least one of said plurality of said batteries and with said central processor, for collecting and processing data related to current from said series loop.

11. The system of claim 8, further comprising:

an auxiliary power converter, in communication with at least one of said batteries and with said central computer, for providing power to the system.

12. The system of claim 8, further comprising:

a converter, in communication with said central computer and with at least one of said plurality of transceivers, for converting data between optical and electrical forms.

13. A method for managing a battery monitoring system having at least two interconnected batteries and a monitor in operable relation to each one of the batteries for monitoring a physical parameter of the battery, comprising the steps of:

providing central processing means, in communication via at least a partially optical transmission path with each one of the monitors, for processing data received in packets from each one of the monitors; and interpreting said packet data received by said central processing means as representing the physical parameter being monitored.

14. The method of claim 13, further comprising the steps of:

providing data display means in communication with said central processing means for displaying data;

determining the average physical parameter value of the system;

identifying as a battery deviation any physical parameter deviating more than a predetermined amount from said average physical parameter value; and displaying said battery deviation on said display means.

15. The method of claim 14, further comprising the step of:

displaying at least one system parameter on said display means.

16. The method of claim 13, wherein the interpreting step uses a packet protocol.

17. The method of claim 13, further comprising the step of:

identifying as a system fault any physical parameter received by said central processing means outside a predetermined operational limit; and displaying said system fault on said display means.

* * * * *